(12) United States Patent
Mochizuki (10) Patent No.: US 7,904,771 B2
(45) Date of Patent: Mar. 8, 2011

(54) SELF-DIAGNOSTIC CIRCUIT AND SELF-DIAGNOSTIC METHOD FOR DETECTING ERRORS

(75) Inventor: Hideo Mochizuki, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 185 days.

(21) Appl. No.: 12/292,862

(22) Filed: Nov. 26, 2008

(65) Prior Publication Data

US 2009/0138767 A1 May 28, 2009

(30) Foreign Application Priority Data

Nov. 27, 2007 (JP) ................................. 2007-305396

(51) Int. Cl.
*G01R 31/28* (2006.01)
(52) U.S. Cl. ........................................................ 714/724
(58) Field of Classification Search .................. 714/704, 714/724
See application file for complete search history.

(56) References Cited

U.S. PATENT DOCUMENTS

| | | | | |
|---|---|---|---|---|
| 5,987,629 A * | 11/1999 | Sastry et al. | ..................... | 714/48 |
| 6,012,148 A * | 1/2000 | Laberge et al. | ................... | 714/2 |
| 7,617,424 B2 * | 11/2009 | Frodsham et al. | ............. | 714/704 |
| 2004/0078690 A1* | 4/2004 | Kohashi | .......................... | 714/38 |
| 2004/0199834 A1* | 10/2004 | Fukae | ............................ | 714/699 |
| 2005/0257104 A1* | 11/2005 | Wood | ............................. | 714/704 |

FOREIGN PATENT DOCUMENTS

JP    4-245309    9/1992

* cited by examiner

*Primary Examiner* — James C Kerveros
(74) *Attorney, Agent, or Firm* — McGinn IP Law Group, PLLC (57) ABSTRACT

A self-diagnostic circuit includes a setting unit receiving a plurality of detection signals generated in an integrated circuit device, and determining a type of detection signal to be detected among the received plurality of detection signals. A counter is coupled to the setting unit and counts a number of a signal corresponding to the type of the detection signal to be detected.

13 Claims, 8 Drawing Sheets

SELF-DIAGNOSTIC CIRCUIT AND SELF-DIAGNOSTIC METHOD FOR DETECTING ERRORS

BACKGROUND OF THE INVENTION

1. Field of the Invention

The present invention relates to a self-diagnostic circuit and to a self-diagnostic method which detect an error in an integrated circuit.

2. Description of Related Art

Regardless of the device in which it is installed, an integrated circuit is required to have high reliability. In order to improve reliability, an integrated circuit may include a self-diagnostic circuit. The self-diagnostic circuit monitors operation in the integrated circuit, and detects failure and performance deterioration of the integrated circuit.

JP-A-HEI4-245309 discloses a semiconductor device which has such a self-diagnostic circuit.

JP-A-HEI4-245309 discloses a digital controller that has counters to count a number of retries for each diagnostic item in the integrated circuit, and indicates that an error is a serious error when the number of retries is large (i.e., over a predetermined threshold).

However, the present inventor recognized that in the technology of JP-A4-245309, since a counter was provided for every diagnostic item, and the number of diagnostic items also increased with increased scale of the integrated circuit and more advanced features, there was a problem in that the circuit scale of the self-diagnostic part also increased.

SUMMARY OF THE INVENTION

The present invention seeks to solve one or more of the above problems or to improve upon those problems at least in part.

In one exemplary embodiment, the self-diagnostic circuit according to the present invention has a setting unit receiving a plurality of detection signals generated in an integrated circuit device, and determining a type of detection signal to be detected among the received plurality of detection signals, and a counter coupled to the setting unit and counting a number of a signal corresponding to the type of the detection signal to be detected.

Due to this construction, the exemplary self-diagnostic circuit according to the present invention can detect any failure with a simple construction.

In another exemplary embodiment, there is provided a self-diagnostic method which performs self-diagnosis of an integrated circuit device including a cache memory by a self-diagnostic circuit comprising, a setting unit receiving a plurality of detection signals generated in the integrated circuit device, and determining a type of the detection signal to be detected among the received plurality of detection signals, and a counter coupled to the setting unit and counting a number of a signal corresponding to the type of the detection signal to be detected, the method comprising, executing an evaluation target program in the integrated circuit device, setting for extracting a command execution with respect to the setting unit, acquiring, by the counter, a number of commands executed by the integrated circuit device, setting for extracting an error in accessing the cache memory with respect to the setting unit, acquiring, by the counter, the number of errors in accessing the cache memory and determining a presence or an absence of an infinite loop of the evaluation target program based on the number of commands executed by the integrated circuit device, and the number of errors in accessing the cache memory.

Due to these steps, in the exemplary self-diagnostic method of the present invention, a program error can be discovered from the presence or absence of an infinite loop.

In yet another exemplary embodiment, there is provided a self-diagnostic method which performs self-diagnosis of an integrated circuit device including a Direct Memory Access (DMA) processor by a self-diagnostic circuit comprising, a setting unit receiving a plurality of detection signals generated in the integrated circuit device, and determining a type of the detection signal to be detected among the received plurality of detection signals, and a counter coupled to the setting unit and counting a number of a signal corresponding to the type of the detection signal to be detected, the method comprising, performing data transfer by using the Direct Memory Access processor in the integrated circuit device, setting for extracting data transfer in the integrated circuit device with respect to the setting unit, counting, by the counter, a number of data transfer in the integrated circuit device, setting for extracting memory accesses in the integrated circuit device with respect to the setting unit, counting, by the counter, a number of memory accesses in the integrated circuit device, and determining a malfunction of the Direct Memory Access processor based on a difference between a number of data transfers and the number of memory accesses.

Due to these steps, in the exemplary self-diagnostic method of the present invention, a deadlock state of the Direct Memory Access processor can be detected.

In yet another exemplary embodiment, there is provided a self-diagnostic method which performs self-diagnosis of an integrated circuit device by a self-diagnostic circuit comprising, a setting unit receiving a plurality of detection signals generated in the integrated circuit device, and determining a type of the detection signal to be detected among the received plurality of detection signals, and a counter coupled to the setting unit and counting a number of a signal corresponding to the type of the detection signal to be detected, the method comprising, performing communication with a target circuit based on an evaluation target program, the target circuit comprising a communication target of the integrated circuit device, setting for extracting the communication with the communication target based on the evaluation target program with respect to the setting unit, counting, by the counter, a number of communications with the communication target is counted based on the evaluation target program, and detecting a malfunction of one of the target circuit and the integrated circuit device from the number of communications with the communication target based on the evaluation target program.

Due to these steps, in the exemplary self-diagnostic method of the present invention, communication errors can be discovered.

BRIEF DESCRIPTION OF THE DRAWINGS

The above and other aspects, advantages and features of the present invention will be more apparent from the following description of certain exemplary embodiments taken in conjunction with the accompanying drawings, in which.

DETAILED DESCRIPTION OF THE EXEMPLARY EMBODIMENTS

The invention will be now described herein with reference to illustrative embodiments. Those skilled in the art will recognize that many alternative embodiments can be accomplished using the teachings of present invention and that the invention is not limited to the exemplary embodiments illustrated for explanatory purposes.

First Exemplary Embodiment

Figure 1:
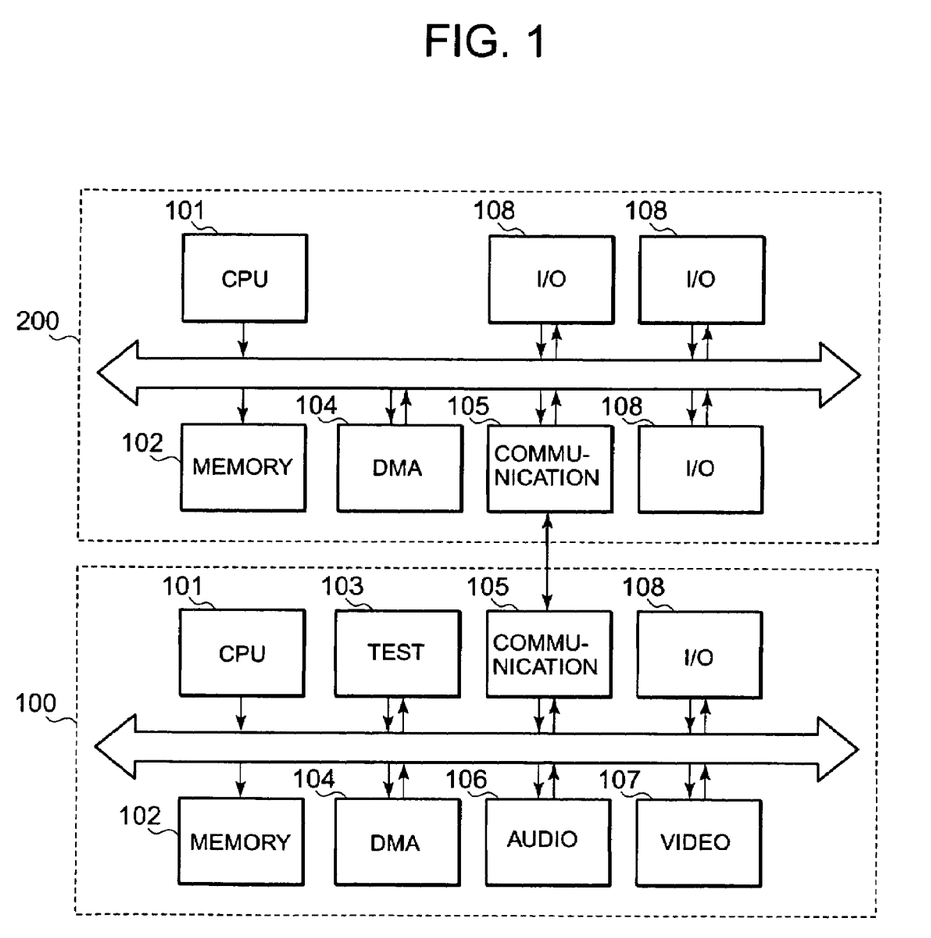
FIG. 1 is a block diagram showing a system to which the self-diagnostic circuit of the present invention is applied.

FIG. 1 is a block diagram showing a system including an integrated circuit 100 and integrated circuit 200 with a built-in self-diagnostic circuit. As shown in FIG. 1, the integrated circuit 100 has a central processing unit (CPU) 101, memory 102, self-diagnostic circuit (hereafter, "test circuit") 103, direct memory access controller (DMA) 104, communications unit 105, audio processor (AUDIO) 106, video processor (VIDEO) 107, and I/O control unit (I/O unit) 108.

The CPU 101 is a circuit which performs various processing based on a program, etc., stored by a read-only memory (ROM) in the memory 102, etc., for example. The memory 102 is a storage unit including a ROM and a random access memory (RAM), etc., that holds programs executed by the CPU and temporarily stores data during processing. The DMA 104 controls access when the CPU 101 and other functional blocks access the memory. The communications unit 105 is a control unit that controls communication when the integrated circuit 100 communicates with other integrated circuits (for example, the integrated circuit 200). The AUDIO 106 processes audio data in the integrated circuit 100. The VIDEO 107 processes image data in the integrated circuit 100. The I/O unit 108 controls I/O data of the integrated circuit 100.

For ease of understanding, the construction of the integrated circuit 200 does not include the audio processor 106, video processor 107 and test circuit 103, but is otherwise identical to the construction of the integrated circuit 100. Therefore, identical reference numerals are assigned to identical portions of the integrated circuit 100, and a description thereof is omitted. The construction shown in FIG. 1 is an example of an integrated circuit which constitutes a microcomputer, but the microcomputer may be constituted by various functional blocks depending on the function it is desired to realize.

Here, the test circuit 103 included in the integrated circuit 100 is a circuit which determines failure and deterioration of the integrated circuit 100 based on various signals outputted from other circuits included in the integrated circuit 100. The test circuit 103 of the first exemplary embodiment is a circuit which counts various error flags outputted from other circuits, and outputs a number of errors. A more detailed test circuit 103 according to the first detailed embodiment is shown in FIG. 2.

Figure 2:
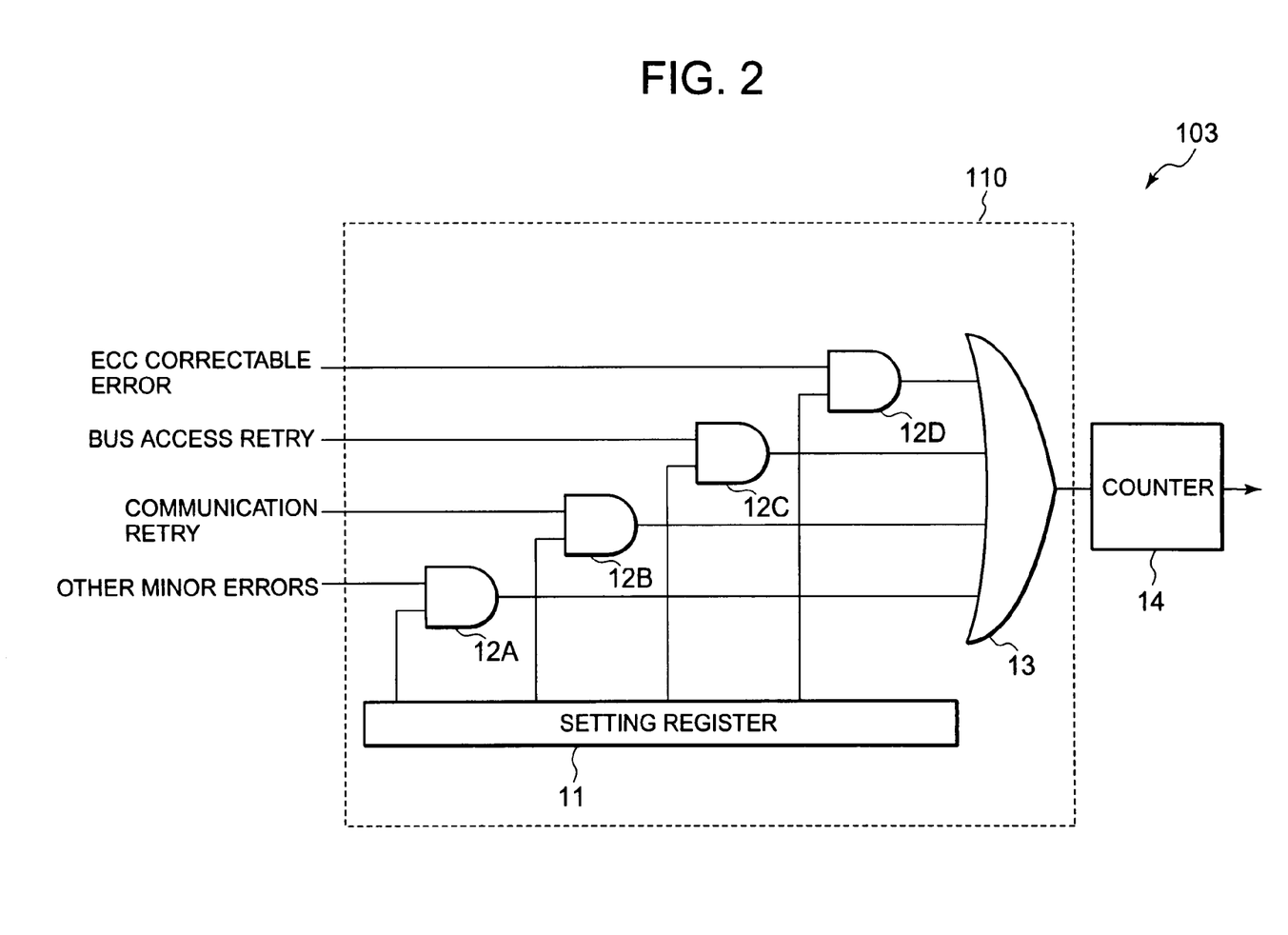
FIG. 2 is a diagram showing a construction of a self-diagnostic circuit of the present invention.

As shown in FIG. 2, the test circuit 103 according to the first exemplary embodiment has a setting register 11, a plurality of AND circuits 12A-12D, a logical addition OR circuit 13, and a counter 14. The setting register 11 is a register for setting an error flag which is counted based on a signal outputted from the other circuit blocks, or a signal inputted from the outside. The errors that are counted can be set by control software inputted from the outside during a test, or a control program stored in the internal ROM. In addition, the setting can also be changed by a signal or the like supplied from outside during a test. Therefore, according to the first exemplary embodiment, a setting unit 110 which sets an error counted by this setting register 11 and the AND circuit 12 is provided.

Setting values outputted from a setting register 11, and error signals outputted from various points of the integrated circuit 100, are inputted to the AND circuits 12A-12D. The AND circuit outputs an error flag inputted based on the output of the setting register 11 to the latter parts.

Specifically, when a "L" level signal is inputted as the output value of the setting register 11, it operates as a masking circuit which masks the error flag. Here, the error flag outputted from other functional blocks of the integrated circuit 100 is a signal showing that a minor error occurred. Although it depends on the functions performed by the integrated circuit 100, minor errors are errors which can be corrected by an Error Correction Code (ECC) or the like, and errors which may occur occasionally during operation of the integrated circuit 100 such as a bus access retry and a communication retry. Specifically, when the integrated circuit 100 operates and an error occurs, it is considered as a minor error if it does not cause a malfunction in the operation of the system which uses the microcomputer of the integrated circuit 100. On the other hand, if the error causes a malfunction in the operation of the system which uses the microcomputer of the integrated circuit 100, it is considered to be a serious error.

The output of the AND circuits 12A-12D is connected to the OR circuit 13. The OR circuit 13 inputs an error flag to the counter 14 when an error flag is outputted from any of the AND circuits 12A-12D. The counter 14 counts the number of inputted error signals, and outputs the count value.

Figure 3:
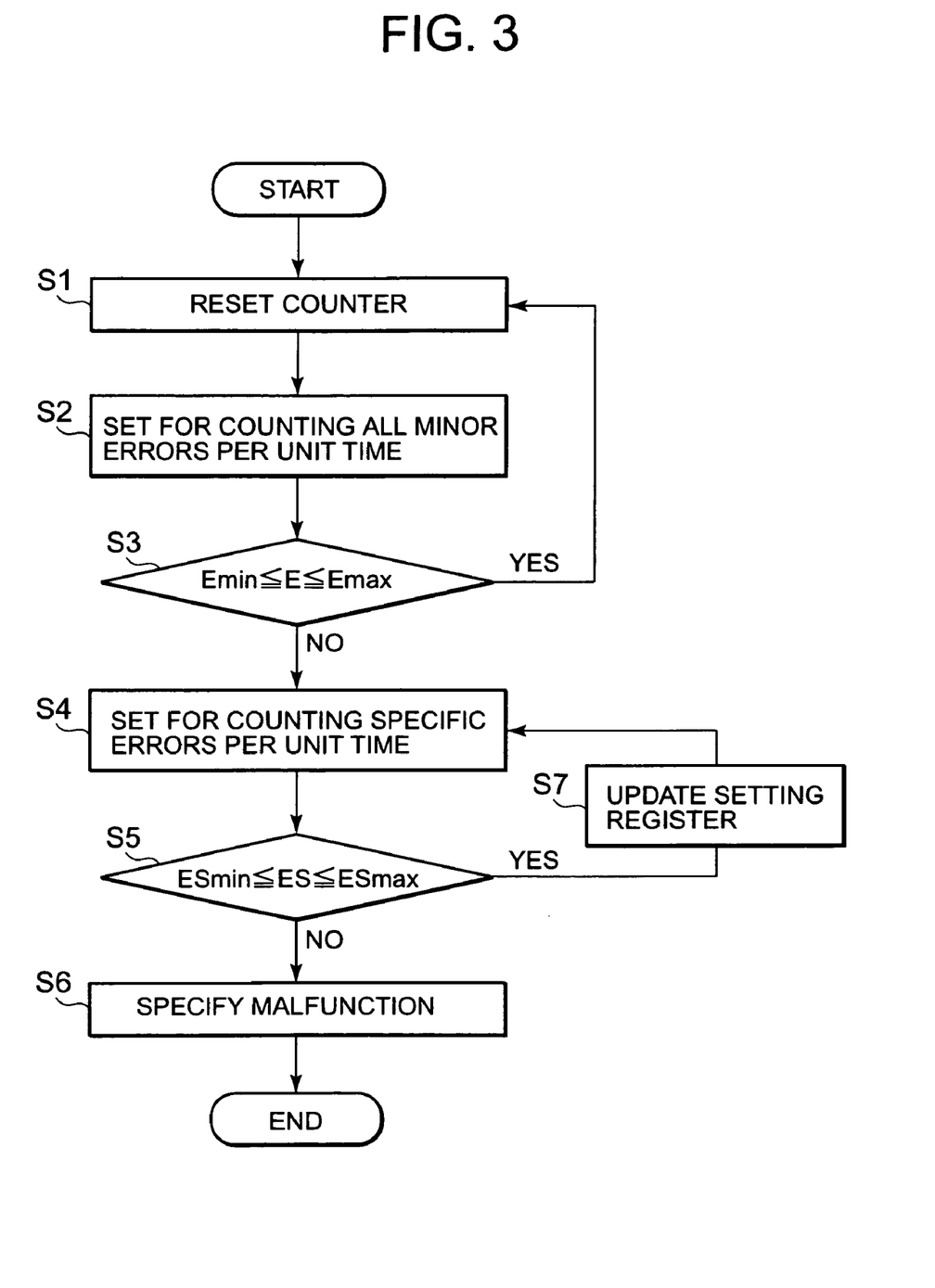
FIG. 3 is a flow chart showing an operation of a self-diagnostic circuit of the present invention.

FIG. 3 is a flow chart showing the operation of the self-diagnostic circuit 103 constituted as described above. Hereafter, an operation wherein the self-diagnostic circuit of the first exemplary embodiment detects a minor error will be described using FIG. 3.

In a Step S1 shown in FIG. 3, a reset signal is inputted to the counter 14 and the value of the counter is initialized.

Next, in a Step S2 shown in FIG. 3, the setting register 11 is set to count all minor errors. In the first exemplary embodiment, since the error signals inputted into the AND circuits 12A-12D are not masked, for example in the case of a 4-bit setting register, "1" is written in all the bits. Since the setting register 11 outputs "1" to all the AND circuits 12A-12D, the AND circuits 12A-12D output the error signals inputted to the OR circuit 13 without modification. The OR circuit 13 sums the error signals outputted from the AND circuits 12A-12D, and outputs them to the counter 14. In order to count minor errors generated per unit time, this register is again completely rewritten by "0" after the unit time has elapsed.

In a Step S3, the number of errors counted by the counter 14 in the above-mentioned Step S2 is compared with a pre-assumed (predetermined) permitted number of errors. Specifically, when the error number is E, the minimum value of the assumed number of errors is Emin and the maximum value of the assumed number of errors is Emax, it is determined whether Emin≦E≦Emax. Here, within the limits of Emin≦E≦Emax, the routine returns to Step S1, and if E<Emin or Emax<E, the routine proceeds to a next Step S4.

In the Step S4, the setting register 11 is set to a state where specific minor errors are counted. According to the first exemplary embodiment, error signals inputted into the AND circuit 12A are not masked, and error signals inputted into the AND circuits 12B-12D are masked. For example, in the case of a 4-bit setting register 11, "1" is written only in bits corresponding to the AND circuit 12A. Since "0" is written in the bits corresponding to the other AND circuits 12B-12D, error signals are masked, and the errors counted by the counter 14 via the OR circuit 13 are only specific errors. To count the errors generated per unit time as described above, this register 11 is again completely rewritten by "0" after the unit time has elapsed.

In a Step S5, the number of specific errors counted by the counter 14 in the aforesaid Step S4 is compared with a pre-assumed (predetermined) permitted number of errors. Specifically, if the error number is ES, the minimum value of the assumed number of errors is ESmin and the maximum value of the assumed number of errors is ESmax, then it is determined whether ESmin≦ES≦ESmax. Here, if ESmin≦ES≦ESmax, in a Step S7, then the value of the setting register 11 is rewritten, and the routine returns to the Step S4. If ES<Emin or ESmax<ES, then it is determined that the part concerned with counting specific errors is faulty, and the self-diagnostics is terminated in the Step S6.

Hence, according to the first exemplary embodiment, when all minor errors are counted and the count value exceeds tolerance, it is possible to specify which error has occurred and is causing a malfunction.

Second Exemplary Embodiment

Figure 4:
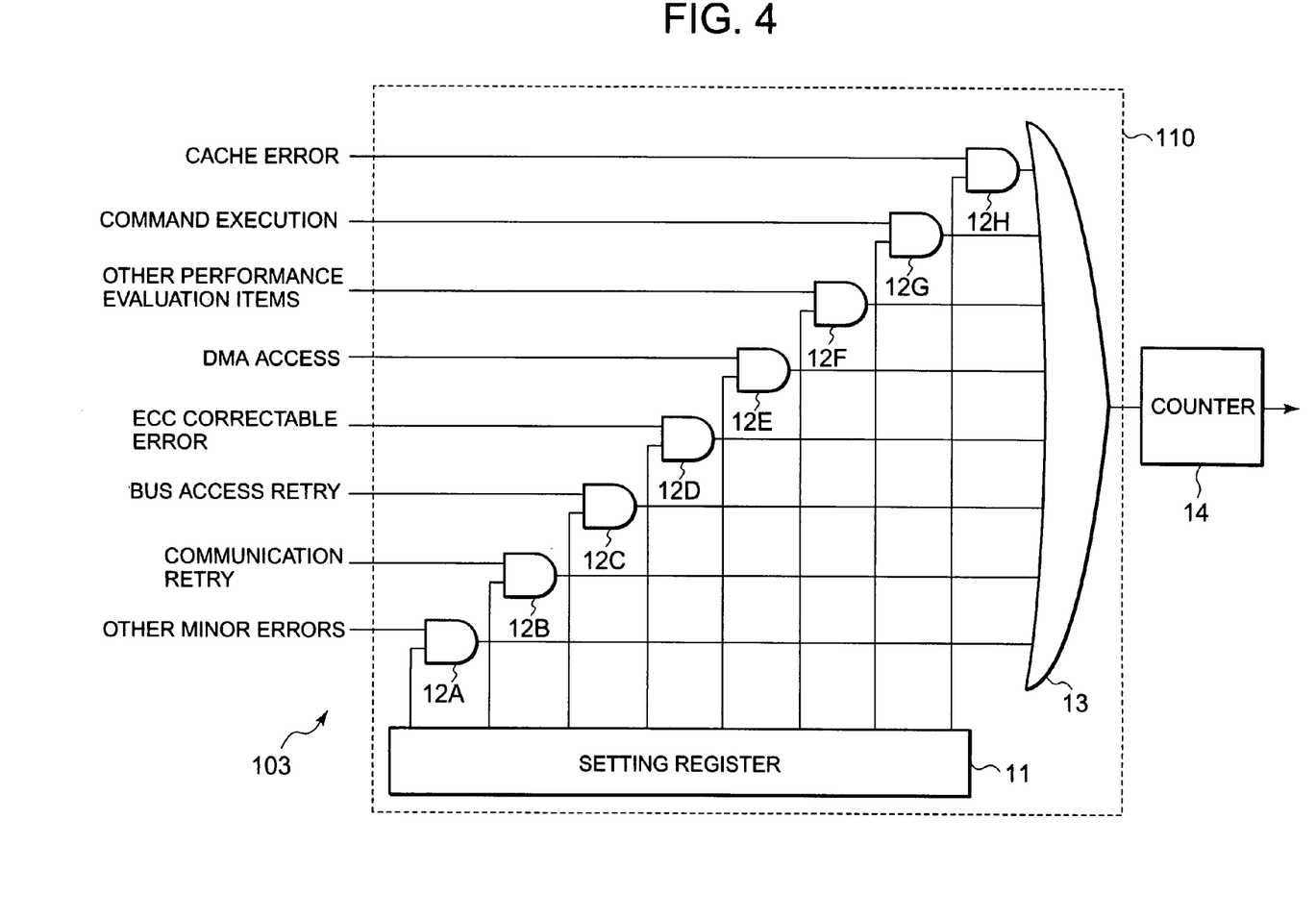
FIG. 4 is a diagram showing a construction of a self-diagnostic circuit in a case of detecting an infinite loop.

FIG. 4 is a diagram showing a self-diagnostic test circuit 103 according to a second exemplary embodiment of the present invention. In the test circuit according to the second exemplary embodiment, the test circuit 103 can detect an infinite loop due to a program error in addition to the aforesaid minor errors. In FIG. 4, the same numerals are assigned to the same parts as those of FIG. 2, and a detailed explanation thereof is omitted.

According to the second exemplary embodiment, in addition to the AND circuits 12A-12D into which minor error signals are inputted in the first exemplary embodiment, there are more input signals in order to count other items. Also, AND circuits 12E-12H are added so that other items can be masked.

Figure 5:
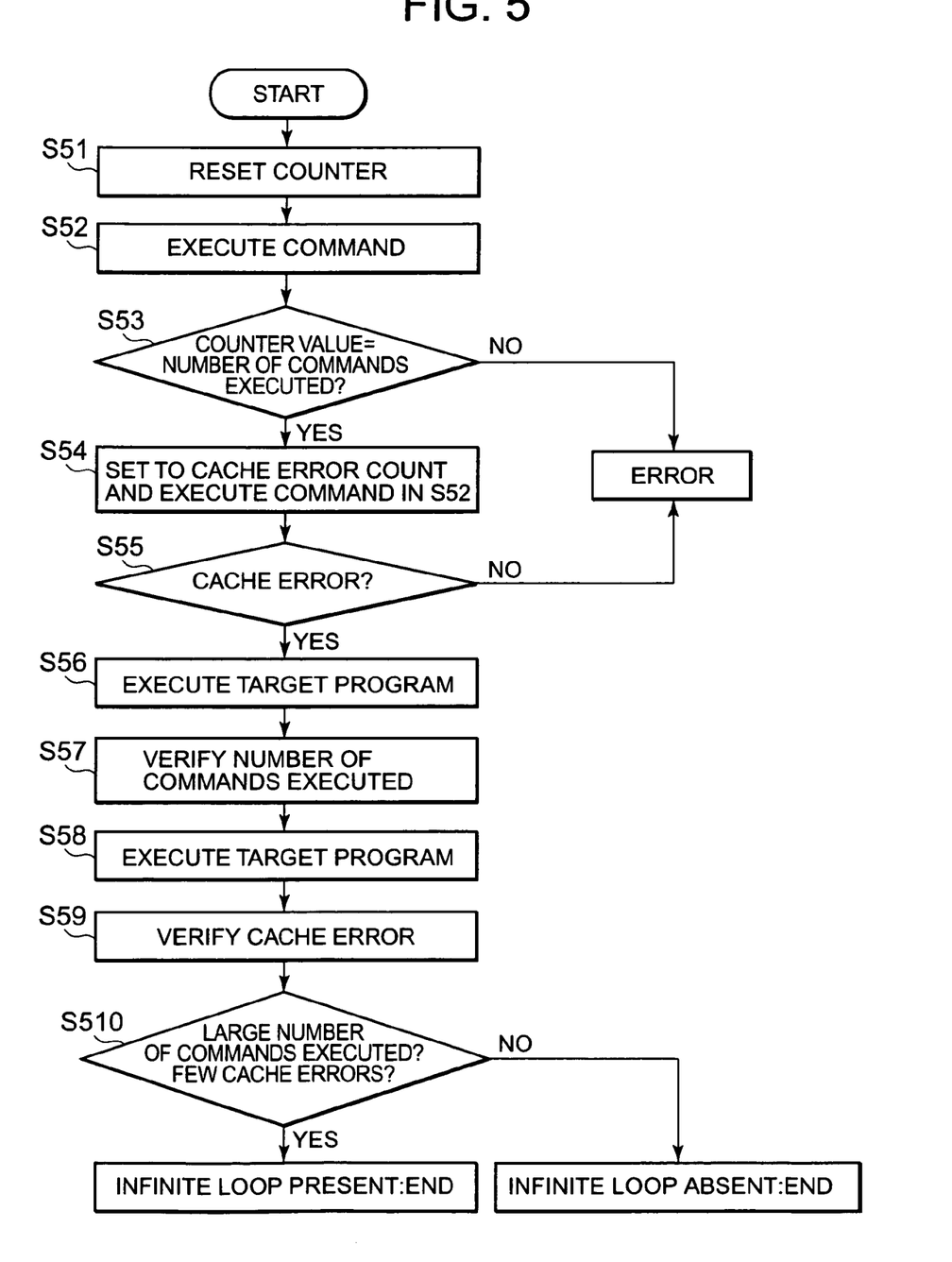
FIG. 5 is a flow chart showing an operation in the case of detecting an infinite loop.

When detecting an infinite loop, signals are used which are inputted into the AND circuit 12G into which a flag that executed a command is inputted, and the AND circuit 12H into which a flag of a cache error is inputted. It is assumed that the mask function of the AND circuits 12A-12H is performed by a value set in the setting register as in the first exemplary embodiment. FIG. 5 is a flow chart showing an operation for diagnosing whether the circuit is in an infinite loop according to the second exemplary embodiment. Hereafter, the determination regarding the presence or absence of an infinite loop according to the second exemplary embodiment will be described referring to FIG. 5.

In a Step S51 shown in FIG. 5, the counter 14 is reset, and the value of the counter 14 is initialized. In this state, the setting register 11 is set so that only the number of commands executed is counted, and the number of errors is not counted.

In a Step S52, the integrated circuit 100 is made to execute a plurality of commands which do not fall into an infinite loop. Here, it is assumed that the number of commands and their contents are predetermined. The commands performed here are for example addition commands and the like which do not start a branching operation.

In a Step S53, the value of the counter 14 is read, and a comparison is made as to whether the number of commands executed and the count value of the counter 14 coincide. If the number of commands executed above and the count value of the counter 14 coincide, then it is assumed the integrated circuit 100 is executing commands correctly and that their number was correctly counted by the self-diagnostic test circuit 103, so the routine proceeds to the next Step S54. If the number of commands executed and the count value do not coincide, then it is determined that the command execution unit, for example a CPU 101 or the command transmission system, has an error.

In the Step S54, the setting register 11 is set to a value which counts only the number of cache errors, and the integrated circuit 100 is again made to execute the commands used above.

In a Step S55, the value of the counter 14 is read, and it is verified whether there is a cache error. In this case, if cache errors have occurred to some extent, then it is assumed the test circuit 103 has counted the cache errors correctly, and the routine proceeds to the next step.

In a Step S56, a setting point is written to the setting register 11 so that only the number of commands executed is measured. Next, the integrated circuit 100 is made to execute a program which verifies the presence or absence of an infinite loop.

In a Step S57, the count value of the counter 14 is read and the number of commands executed is verified.

In a Step S58, a setting point is written to the setting register 11 so that only the number of cache errors is measured. Next, the integrated circuit 100 is again made to execute a program which verifies the presence or absence of an infinite loop.

In a Step S59, a count value of the counter 14 is read, and the number of cache errors is verified.

Here, when the target program has an infinite loop, the number of commands executed becomes extremely large, and since the commands remain in the cache memory, cache errors decrease. Therefore, the count value in the above-mentioned Step S56 increases, and the count value in the Step S58 decreases. According to the second exemplary embodiment, the steps of S55-S58 are performed a plurality of times, and when the difference between the number of commands executed and the cache error is very large, it is determined that the target program has an infinite loop.

Figure 6:
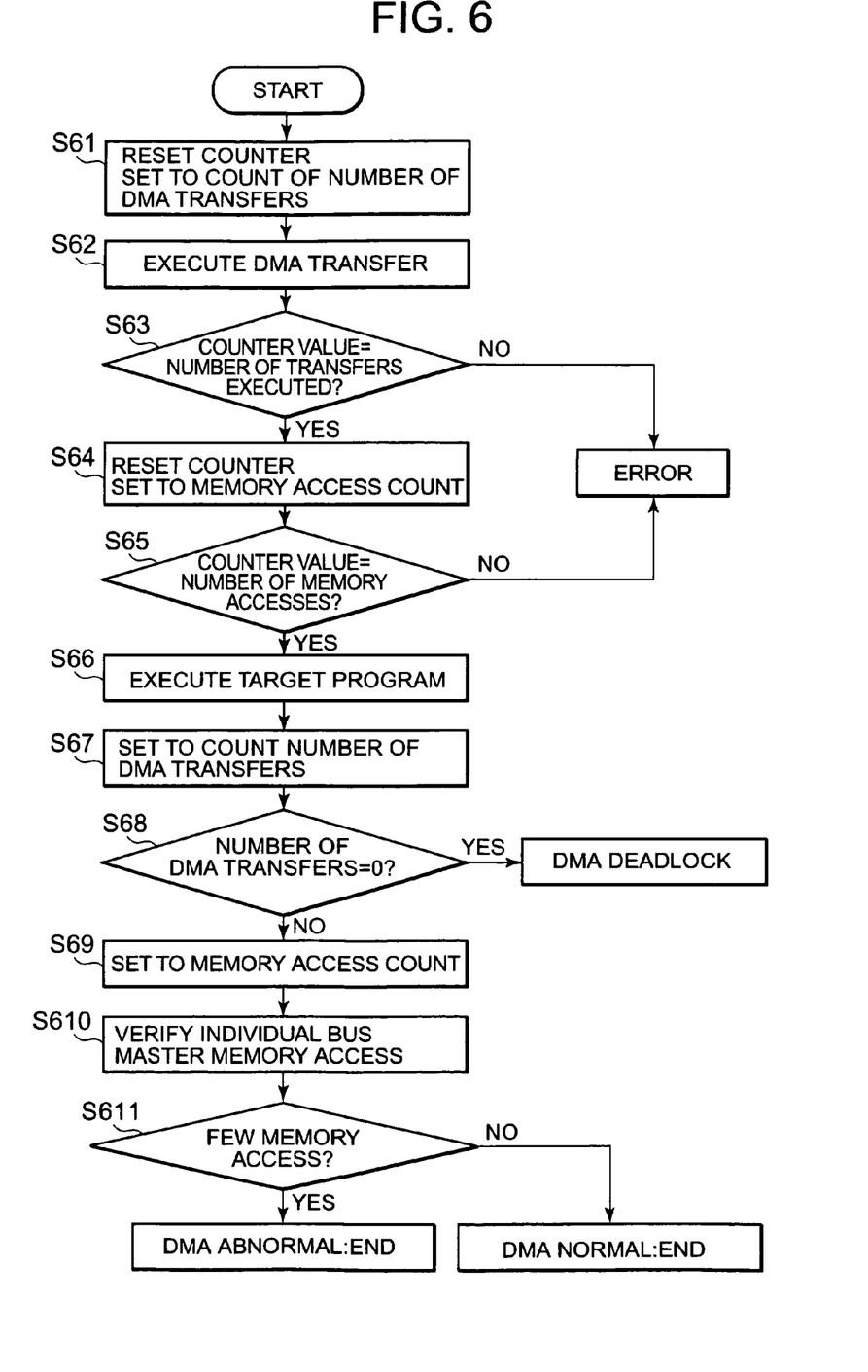
FIG. 6 is a flow chart showing an operation in a case of detecting a DMA deadlock.

In the test circuit 103 according to the second exemplary embodiment, the test circuit 103 can further detect a case where the DMA 104 is in a deadlock. FIG. 6 is a flow chart showing an operation for diagnosing whether the DMA is in a deadlock according to the second exemplary embodiment. Hereafter, a determination regarding the presence or absence of a deadlock according to the second exemplary embodiment will be described referring to FIG. 6.

In a Step S61 shown in FIG. 6, the counter 14 is initialized. A setting point which counts only the number of DMA transfers is written in the setting register 11.

In a Step S62, data transfer using a DMA is performed at least once. The number of DMA transfers is not necessarily one, and may be a predetermined number of DMA transfers.

In a Step S63, the value of the counter 14 is read. Here, when the number of DMA transfers held in the counter 14 is equal to a preset number of DMA transfers held in the counter in the Step S62, it is determined that the test circuit 103 is operating correctly and the number of DMA transfers is counted correctly. When it differs from the preset value, it is determined that there is an error in the part from the DMA 104 to the test circuit 103, or in the test circuit 103, and the test is interrupted.

In a Step S64, the counter 14 is initialized. A setting point which counts only the number of memory accesses is written in the setting register 11. In a Step S65, the value of the counter 14 is read, and the number of memory accesses is verified. When the number of memory accesses is equal to a preset number of DMA transfers, it is determined that the test circuit 103 is operating correctly and that the number of DMA transfers is counted correctly.

Next, a value that makes the counter 14 count all items is written in the setting register 11.

In a Step S66, a program which is an evaluation target is executed.

In a Step S67, the system is again set to count the number of DMA transfers, and in a Step S68, the count value of the number of DMA transfers after a definite period of time is verified. Here, when the DMA is in deadlock, the number of DMA transfers is 0.

In a Step S69, the system is set to count memory accesses as in the Step S68. In a Step S610, the value of the counter 14 is examined after a definite period of time. If there are few memory accesses, then it can be determined that some malfunction has occurred. In this state, the number of memory accesses of an individual bus master is examined. When an error recurs, in a Step S611, the fact that there are fewer memory accesses than the assumed number indicates that the cause is a DMA problem.

Figure 7:
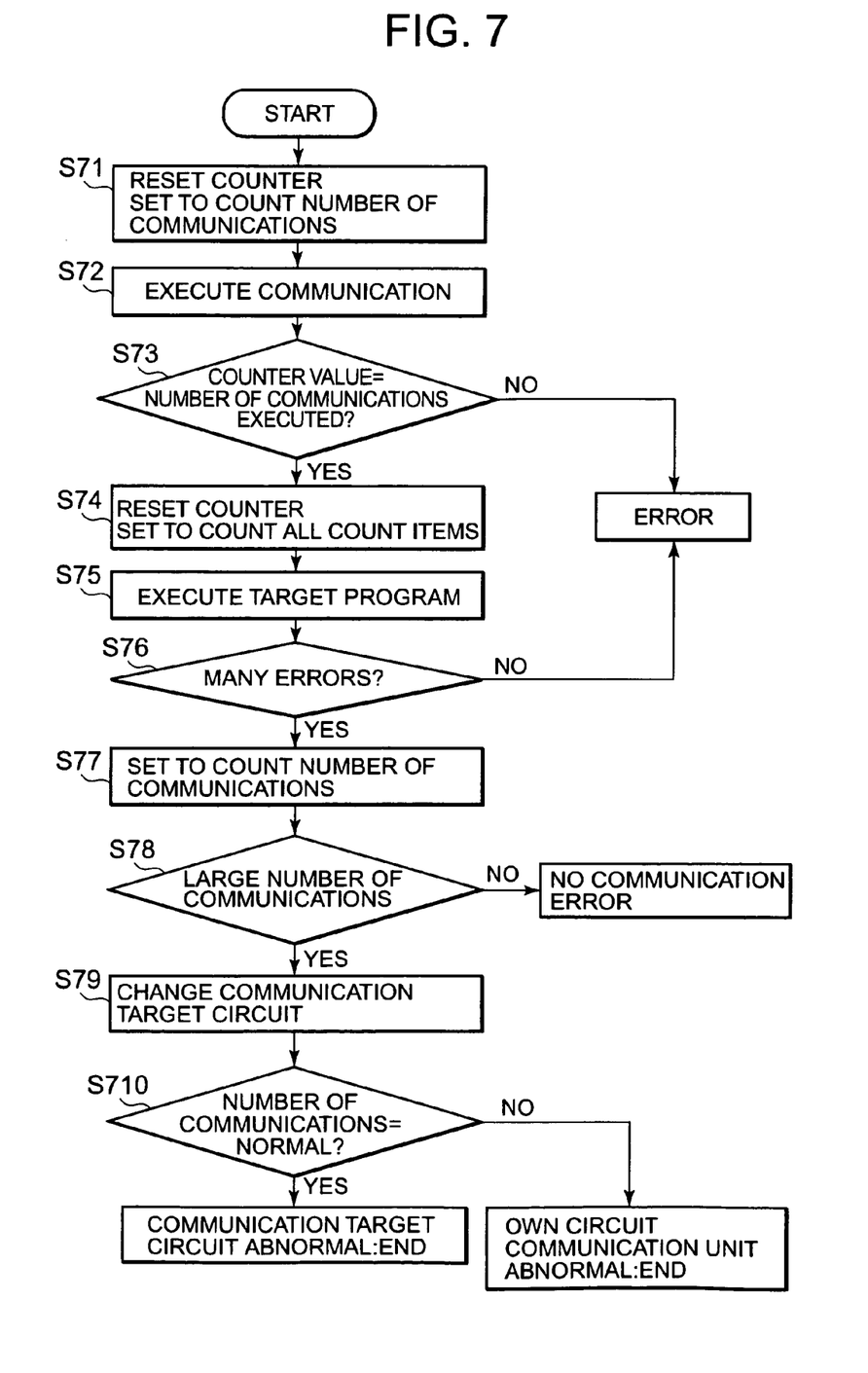
FIG. 7 is a flow chart showing an operation in a case of detecting a communication error.

In the test circuit 103 according to the second exemplary embodiment, in the integrated circuit 100 which performs communication, it is also possible to detect a malfunction of the integrated circuit 200 which is a communication partner. FIG. 7 is a flow chart showing a process when a malfunction of an integrated circuit 200 which is a communication target is detected. Hereafter, an operation which detects a malfunction of the integrated circuit 200 which is a communication partner will be described referring to FIG. 7.

In a Step S71, the counter 14 is initialized. A setting register 11 is set so that only instances of communications are counted.

In a Step S72, communication between the integrated circuits 100 and 200 is performed a preset number of times.

In a Step S73, the value of the counter 14 is read, and it is examined whether the path of the test circuit 103 is operating correctly from the execution of the communication. Here, when the value of the counter 14 coincides with the number set in the Step S72, it is determined that the path from the communications unit to the counter 14 is operating normally.

In a step S74, a value that sets all the targets counted by the counter 14 is written in the setting register 11.

In a Step S75, a program which is an evaluation target is executed.

In a Step S76, the overall number of errors is verified. If it is different from the normally assumed number of errors, then it can be detected that there is a malfunction.

In a Step S77, the setting register 11 is changed over to a mode which counts the number of communications per unit time, and in a Step S78, the count value of the number of communications per unit time is verified. Here, when a communications part has caused a malfunction, an unexpected value is shown as the communication number.

In a Step S79, the integrated circuit used as a communication target is changed, and the same test is repeated.

In a Step S710, if as a result of changing the integrated circuit of the communication target, the value becomes normal, then it is determined that the integrated circuit 200 of the communication target has a malfunction. If an abnormal value is still shown even when the integrated circuit of the communication target is changed, then it is determined that the communications unit of the integrated circuit 100 itself has a malfunction.

Third Exemplary Embodiment

Figure 8:
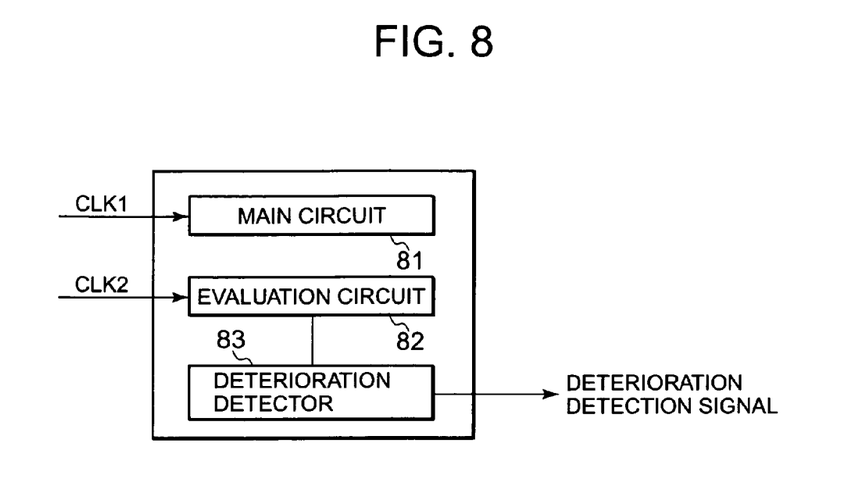
FIG. 8 is a diagram showing a construction of a microcomputer or the like in a case of detecting a circuit deterioration.

According to the first exemplary embodiment and second exemplary embodiment, examples were shown where errors of the integrated circuit were specified. However, the test circuit of the present invention can also detect deterioration of a main part of the integrated circuit. FIG. 8 shows a circuit which detects deterioration of the integrated circuit itself. As shown in FIG. 8, a circuit which detects deterioration of the integrated circuit has a main circuit 81, evaluation circuit 82, and deterioration detector 83.

In FIG. 8, a normal operation clock CLK1 is inputted into the main circuit 81, and a clock CLK2 having a frequency higher than that of the normal operation clock is inputted into the evaluation circuit 82. The evaluation circuit 82 which operates by the clock CLK2 having a frequency higher than that of the clock CLK1 which operates the main circuit 81 deteriorates earlier than the main circuit 81. This deterioration appears in an output delay of the evaluation circuit 82. The deterioration of the evaluation circuit 82 is detected by using the deterioration detector 83 which detects this delay.

Figure 9:
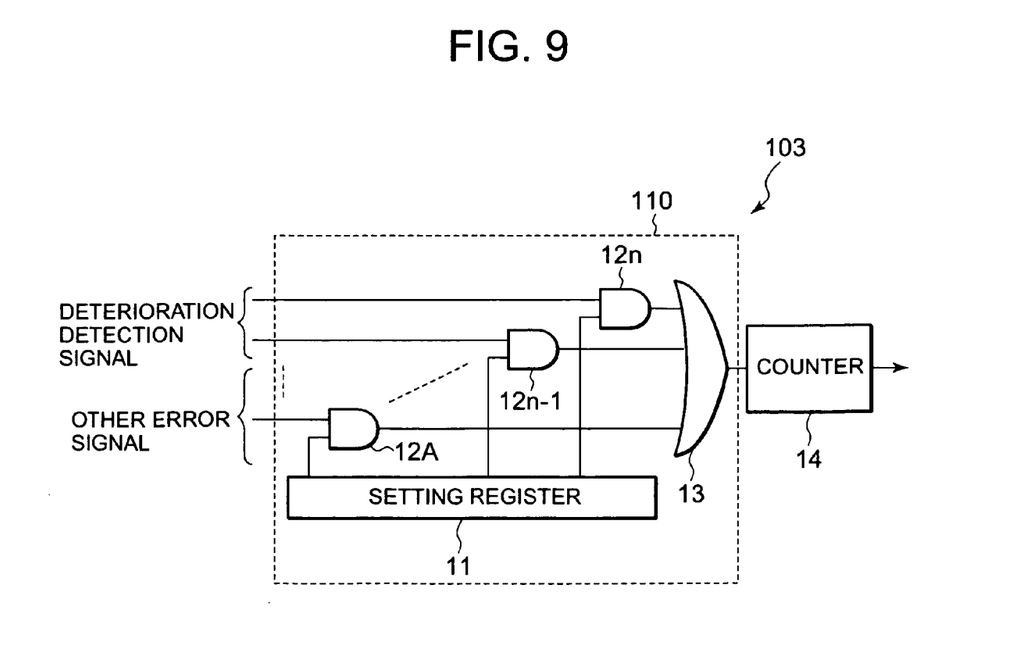
FIG. 9 is a diagram showing a construction of a self-diagnostic circuit in the case of detecting a circuit deterioration.

A plurality of the evaluation circuits 82 and deterioration detectors 83 can be provided at arbitrary locations in a circuit. Therefore, as shown in FIG. 9, a plurality of deterioration detection signals are inputted into the inputs of the test circuit of the present invention, and by suitably narrowing down deterioration locations by setting registers, the locations in the circuit which are prone to deterioration can be specified.

Although the invention has been described above in connection with several exemplary embodiments thereof, it will be appreciated by those skilled in the art that those embodiments are provided solely for illustrating the invention, and should not be relied upon to construe the appended claims in a limiting sense.

Further, it is noted that, notwithstanding any claim amendments made hereafter, applicant's intent is to encompass equivalents all claim elements, even if amended later during prosecution.

What is claimed is:

1. A self-diagnostic circuit, comprising:
 a setting unit configured to receive a plurality of detection signals generated in an integrated circuit device, to output a first signal when the setting unit receives at least one of the detection signals, and to output a second signal when the setting unit receives a specific one of the detection signals, wherein the setting unit does not output the second signal when the setting unit receives detection signals other than the specific one of the detection signals; and
 a counter coupled to the setting unit and configured to count a number of the first signal inputted into the counter;
 wherein the self-diagnostic circuit determines whether the number of the first signal is within a first predetermined range, and the counter is configured to further count a number of the second signal inputted into the counter after counting the number of the first signal if the number of the first signal is within the first predetermined range, and wherein the self-diagnostic circuit specifies an occurred error based on determining whether the number of the second signal is within a second predetermined range.

2. The self-diagnostic circuit according to claim 1, wherein the setting unit comprises:

a setting register holding a setting information, and generating a masking control signal indicating that which one of the detection signals is the specific one of the detection signals; and a masking circuit receiving the detection signals, and masking the received detection signals in a response to the masking control signal.

3. The self-diagnostic circuit according to claim 2, wherein the masking circuit comprises an AND circuit.

4. The self-diagnostic circuit according to claim 2, wherein the setting unit further comprises:

a plurality of the masking circuit respectively receiving one of the detection signals; and an OR circuit coupled to the plurality of the masking circuit, and generating the first signal or the second signal.

5. The self-diagnostic circuit according to claim 2, wherein the detection signal comprises an error detection signal.

6. The self-diagnostic circuit according to claim 5, wherein the self-diagnostic circuit determines a presence or an absence of a malfunction of the integrated circuit device based on a number of the second signal counted per unit time.

7. The self-diagnostic circuit according to claim 2, wherein the mask control signal indicates that a detection signal other than a detection signal showing an error in accessing a cache memory of the integrated circuit device is masked.

8. The self-diagnostic circuit according to claim 1, wherein the integrated circuit device comprises:

a main circuit operating based on a first clock;

an evaluation circuit operating based on a second clock having a frequency higher than that of the first clock; and a deterioration detector outputting a deterioration detection signal indicative of deterioration of a circuit in response to an output of the evaluation circuit, wherein the deterioration detection signal is inputted into the setting unit.

9. The self-diagnostic circuit according to claim 1, wherein the setting unit is configured to receive a command execution flag as one of the detection signals to output a third signal to the counter, and to receive a cache error flag as one of the detection signals to output a fourth signal to the counter, wherein the counter is configured to count a number of the third signal inputted into the counter and to count a number of the fourth signal inputted into the counter, and wherein the self-diagnostic circuit determines that a target program has an infinite loop based on a difference between the number of the third signal and the number of the fourth signal.

10. The self-diagnostic circuit according to claim 9, wherein a setting of the setting unit is changed in a response to an acquired number of signals which fall other than into the infinite loop.

11. The self-diagnostic circuit according to claim 1, wherein the setting unit is configure to receive a Direct Memory Access (DMA) access flag as one of the detection signals to output a fifth signal to the counter, wherein the counter is configured to count a number of the fifth signal inputted into the counter, and wherein the self-diagnostic circuit determines that the DMA is in a deadlock based on the number of the fifth signal.

12. The self-diagnostic circuit according to claim 1, wherein the setting unit is configured to receive a communication retry flag as one of the detection signals to output a sixth signal to the counter, wherein the counter is configured to count a number of the sixth signal inputted into the counter, and wherein the self-diagnostic circuit detects a malfunction of another integrated circuit which is a communication target is occurred based on the number of the sixth signal.

13. The self-diagnostic circuit according to claim 1, wherein the counter counts a number of said detection signals that correspond to a type of the detection signals.

* * * * *